(12) United States Patent
Bailey et al.

(10) Patent No.: US 7,301,373 B1
(45) Date of Patent: Nov. 27, 2007

(54) ASYMMETRIC PRECHARGED FLIP FLOP

(75) Inventors: Daniel William Bailey, Austin, TX (US); Hariharan Kalyanaraman, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 123 days.

(21) Appl. No.: 11/197,706

(22) Filed: Aug. 4, 2005

(51) Int. Cl.
*H03F 3/45* (2006.01)

(52) U.S. Cl. .......................... 327/55; 327/57; 327/208; 327/218; 326/95; 326/96; 326/97

(58) Field of Classification Search ............... None
See application file for complete search history.

(56) References Cited

U.S. PATENT DOCUMENTS

| | | | |
|---|---|---|---|
| 5,712,826 A | | 1/1998 | Wong et al. |
| 5,760,627 A | * | 6/1998 | Gregor et al. ............. 327/215 |
| 5,764,089 A | | 6/1998 | Partovi et al. |
| 5,917,355 A | | 6/1999 | Klass |
| 5,933,038 A | * | 8/1999 | Klass ........................ 327/208 |
| 5,973,955 A | * | 10/1999 | Nogle et al. .............. 365/154 |
| 6,037,824 A | * | 3/2000 | Takahashi .................. 327/337 |
| 6,094,071 A | * | 7/2000 | Ciraula et al. ............... 326/97 |
| 6,278,308 B1 | * | 8/2001 | Partovi et al. .............. 327/218 |
| 6,437,625 B1 | * | 8/2002 | Kojima et al. .............. 327/218 |
| 6,756,823 B1 | * | 6/2004 | Chen et al. ................... 327/52 |
| 7,057,421 B2 | * | 6/2006 | Shi et al. ...................... 327/55 |

* cited by examiner

*Primary Examiner*—Linh My Nguyen
*Assistant Examiner*—William Hernandez
(74) *Attorney, Agent, or Firm*—Meyertons Hood Kivlin Kowert & Goetzel, P.C.; Rory D. Rankin

(57) ABSTRACT

A flip-flop circuit includes a differential stage coupled to a latch stage. The differential stage comprises cross-coupled dynamic logic and only provides a single output to the latch stage. During an evaluation phase, the state of a data input signal is sensed. Depending upon the state of the data input signal, either an output side or reference side of the differential stage is discharged. Also, during the evaluation phase, the latch stage write port is enabled while feedback is disabled, and the flip flop thereby samples and stores an output signal from the output side of the differential stage. Upon initiation of the next precharge phase, the latch stage write port is disabled and feedback is enabled, thereby retaining its present state. Only a single side of the differential stage is used to drive the latch stage and the differential stage may be implemented in an asymmetric fashion.

10 Claims, 6 Drawing Sheets

ASYMMETRIC PRECHARGED FLIP FLOP

BACKGROUND OF THE INVENTION

1. Field of the Invention

This invention relates to flip-flop circuits and, more particularly, to flip-flop circuits having low power consumption, low latency, and low hold-time characteristics.

2. Description of the Related Art

Almost all modern microprocessors use a technique called pipelining to increase throughput. Pipelining involves partitioning a process with "n" steps into "n" hardware stages, each separated by memory elements called registers which hold intermediate results. These registers are typically implemented using flip-flop circuits. There is one pipeline stage for each step in the process. By allowing each of the "n" stages to operate concurrently, the pipelined process could theoretically operate at nearly "n" times the rate of the non-pipelined process.

The benefits of pipelining in a microprocessor may be diminished if the latencies associated with the inter-stage registers consume a sizable percentage of the period of the microprocessor's internal clock. The latency $t_{DQ}$ of a flip-flop circuit may be generally defined as $t_{SU}+t_{CQ}$, where $t_{SU}$ is the setup time and $t_{CQ}$ is the clock-to-valid output time. With ever-increasing clock frequencies, it is becoming increasingly important to implement inter-stage registers of microprocessors using flip-flop circuits with very low latencies.

Another important characteristic associated with the flip-flop circuits which form inter-stage registers in microprocessors is hold-time. The hold-time of a flip-flop circuit is defined as the minimum time the data input signal must be valid following a sampling clock edge. Violations in the hold-time of a flip-flop circuit may result in race conditions. Like latency, it is desirable to reduce the required hold-time characteristics of flip-flop circuits which are used to implement inter-stage registers in microprocessors.

Several additional considerations may also be important in the designs of flip-flop circuits used in microprocessors. For example, it is often important to utilize flip-flop circuits which are associated with low-power consumption characteristics. Low-power consumption is particularly important for microprocessors utilized in mobile applications, such as in lap-top computers.

In addition, it is often desirable to embed logic functionality within the input section of a flip-flop circuit. However, in a typical flip-flop circuit, the addition of logic functionality at the input section creates difficulties since the symmetry in the flip-flop's differential input amplifier section may be lost. For example, a four-input NOR gating function provided on one side of the differential amplifier typically requires that a matching four-input NAND gating function be provided on the opposite side of the differential amplifier.

FIG. 1 is a schematic diagram illustrating a typical prior art flip-flop circuit. The flip-flop circuit of FIG. 1 includes a differential stage 10 coupled to a pair of cross-coupled NAND gates 12. The cross-coupled NAND gates 12 form an S-R latch. During operation, lines 14 and 16 of respective sides of differential stage 10 are precharged high when the clock signal CLK is low. When the clock signal CLK goes high, transistor 18 turns on, as well as one of transistors 20 or 22, depending upon the state of input signals IN_L and IN_H (which are differential in nature). This correspondingly causes one of lines 14 or 16 to be discharged low to Vss. One of the output lines OUT_L or OUT_H of the flip-flop circuit is accordingly driven to a high state, and the other output is driven to a low state. These values are held through the precharge phase of a subsequent clock cycle, and may be altered in accordance with a change in the input signal during a subsequent evaluation phase. It is noted that transitions from low to high in output signal OUT_L (and corresponding transitions from high to low in output signal OUT_H) are caused by discharging line 14 of differential stage 10, while transitions from low to high in output signal OUT_H (and corresponding transitions from high to low in output signal OUT_L) are caused by discharging line 16 of differential stage 10.

Implementations of the flip-flop circuit of FIG. 1 may be associated with relatively high latency and hold-time characteristics, as well as relatively high power consumption characteristics. This is due in part to the fact that both sides of the differential stage are used to control the state of the cross-coupled NAND gates 12, thus requiring that the transistors forming each side of differential stage 10 be of sufficient size to drive cross-coupled NAND gates 12.

It would be desirable to provide a flip-flop circuit which is associated with low power consumption, low latency, and low hold time characteristics.

SUMMARY OF THE INVENTION

A flip-flop circuit is contemplated which includes a differential stage coupled to a latch stage. During an evaluation phase, the state of a data input signal is sensed. Depending upon the state of the data input signal, either an output side or a reference side of the flip flop is discharged. Also, during the evaluation phase, the latch stage write port is enabled, feedback is disabled, and it thereby samples an output signal from the output side of the differential stage. Upon initiation of the next precharge phase, feedback in the latch stage is quickly enabled, the write port is disabled, and it retains its present state.

In one embodiment, only a single side of the differential stage is used to drive the latch stage, and the differential stage may be implemented in an asymmetric fashion. More particularly, transistors forming the reference side of the differential stage may be fabricated using smaller channel widths than corresponding transistors forming the output side of the differential stage. This advantageously allows high speed implementations of the flip-flop circuit while reducing latency, hold-time, and power consumption.

In yet an additional embodiment, complex logic may be added to the differential stage of the flip-flop circuit. The complex logic generates a gating signal to control the output side of the differential stage. The reference side of the differential stage is gated by the complement of the complex logic that gates the output side.

BRIEF DESCRIPTION OF THE DRAWINGS

Other objects and advantages of the invention will become apparent upon reading the following detailed description and upon reference to the accompanying drawings in which.

Figure 1:
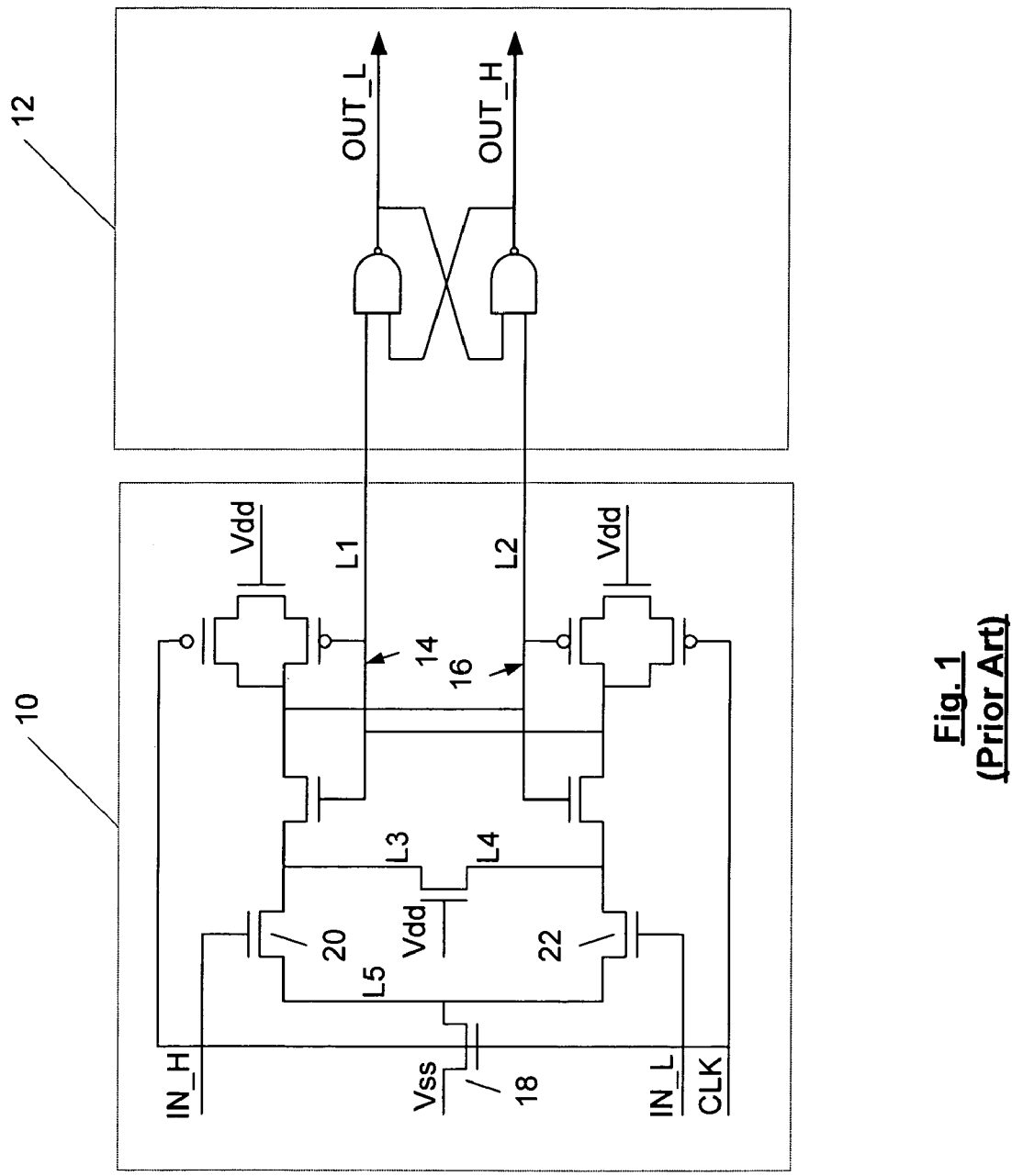
FIG. 1 is a diagram illustrating a prior art flip-flop circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 2:
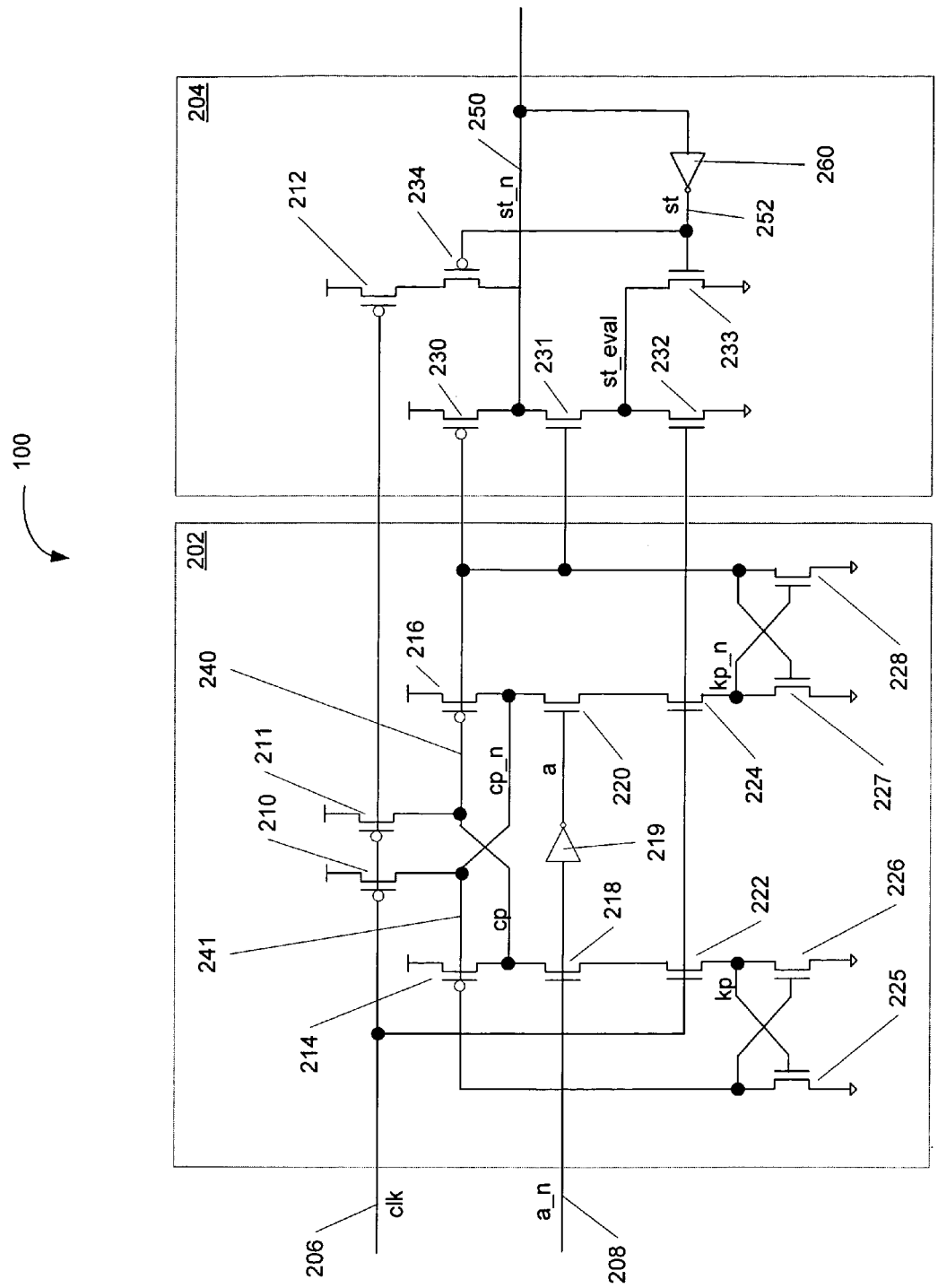
FIG. 2 is a diagram illustrating one embodiment of a flip-flop circuit.

Turning now to FIG. 2, a diagram illustrating one embodiment of a flip-flop circuit 100 is shown. The flip-flop circuit 100 of FIG. 2 includes a differential stage 202 coupled to a latch stage 204. In this embodiment, the flip-flop circuit 100 receives both a data input signal a_n 208 and a clock signal clk 206, and generates a data output signal at an output line 250 of latch stage 204.

During a precharge phase of the operation of flip-flop circuit 100, which is initiated when the clock signal is low, p-channel transistors 210 and 211 turn on, thus precharging lines cp 240 and cp_n 241. Generally speaking, the differential stage 202 may be viewed as having a reference side and an output side. Signal cp 241 may be referred to as a reference line, and signal cp 240 may be referred to as an output line. Signal cp 240 represents the output from differential stage 202, and may similarly be viewed as an input to a "write port" of latch stage 204. The write port of the latch stage 204 is enabled when transistor 232 is turned on during the evaluation stage. In addition, n-channel transistors 222 and 224 turn on. At the start of the precharge phase when the differential clock signal 206 goes low, it is important that the storage state of latch stage 204 is not affected (i.e., is not altered) due to the precharge of line 240. For this reason, n-channel transistor 232 of latch stage 204 is turned off by the clock signal clk 206 during the precharge phase.

In addition, differential stage 202 further includes transistors which are configured to support the output 240 from differential stage during an evaluate phase. In particular, transistors 226 and 227 are turned on during a precharge phase of the circuit 100, and transistors 225 and 228 are turned off during the precharge phase. Generally speaking, each of the pairs of transistors 225-226 and 227-228 may be referred to as keeper circuits as they may serve to "keep" the output 240 of the differential stage during the evaluate phase as described below.

An evaluation phase of flip-flop circuit 100 begins when the clock signal goes high. At this point, n-channel transistors 222 and 224 of differential stage 202 turns on. If the data input signal at line 208 is high at the start of the evaluation phase, n-channel transistor 218 turns on and n-channel transistor 220 turns off (in accordance with inverter 219). Since transistors 218, 222, and 226 are all turned on at this point, line cp 240 will discharge low. As line cp 240 discharges low, n-channel transistors 231 and 227 will turn off, and p-channel transistor 230 will turn on. Further, line cp_n 241 remains high which further keeps n-channel transistor 226 in the on state. Further, the discharge of signal 240 causes transistor 227 to be turned off. The differential stage 202 is thus strongly held in the output low state until a subsequent precharge phase. After the differential stage samples the input and evaluates, transistors 225 and 228 are off. If a_n 208 is initially high when clk 206 transitions high, 218 and 226 are on, and 220 and 227 are off. If a_n 208 then transitions low while clk 206 is high, 218 turns off and blocks the reference side discharge path of the differential stage. However, if a_n 208 transitions low while clk 206 is high, this also turns on transistor 220. Because 227 is off, kp_n charges up which turns on transistor 228, which in turn holds output line 240 low.

Continuing the above scenario when the input signal a_n 208 is high during the evaluation stage, the discharge of signal cp 240 causes p-channel transistor 230 to be turned on and n-channel transistor 231 to be turned off. Consequently, state signal st_n 250 is pulled up by p-channel transistor 230. Therefore, in the embodiment shown, the output 250 from latch stage 204 assumes the high state. In addition, state signal 250 is fed back through inverter 252, which results in signal st 252. In this example, st 252 has a low state which turns off n-channel transistor 233 and turns on p-channel transistor 234. Subsequently, during the precharge phase, feedback in the latch stage 204 is used to hold the current state of the output 250. In particular, during the precharge phase, transistor 231 is turned on, but transistor 232 is turned off which disables transistor 232 as a potential discharge path. However, transistor 233 remains as a possible discharge path. If the current state of the output 250 is high, then signal st 252 is low which turns off transistor 233 and turns on transistor 234. Consequently, output 250 is pulled up via transistors 212 and 234 to solidly support the current high state of output signal 250. In contrast, if the current state of output signal 250 is low, then transistor 233 is turned on and transistor 234 is turned off. Therefore, a discharge path is created for output signal 250 which supports the current low state of the output 250.

In the scenario above wherein the data input a_n 208 was high, the relative latency to output may generally be viewed by the number of transitions required by transistors in the critical path to switch from off to on, or vice versa. For example, in the scenario above, upon initiation of the evaluation phase, a_n 208 had a high value. Consequently, n-channel transistor 218 was on and signal cp 240 discharged. The discharge of signal cp 240 caused p-channel transistor 230 to transition from the off state to the on state, and n-channel transistor 231 to transition from the on state to the off state. Generally speaking, the transition in state of transistors 230 and 231 occurs concurrently. While it is understood that there may in fact be differences in the amount of time required to switch from an on to off, or off to on, state for each of transistors 230 and 231, for purposes of relative comparisons these differences will be ignored. Having turned on p-channel transistor 230 and turned off n-channel transistor 231, output signal 250 is pulled up to the high state. Therefore, in this example, two transitions may be required (i.e., the transition caused by transistor 218 and the generally concurrent transition of transistors 230 and 231) for the output signal 250 to assume the proper state.

A similar action occurs if the data input signal at line a_n 208 is low at the start of an evaluation phase, but results in line cp_n 241 being discharged. More particularly, if the data input signal at line a_n 208 is low at the start of an evaluation phase, transistor 218 is biased off and transistor 220 is biased on. This accordingly causes the differential stage output signal at line 240 to remain in the precharged (high) state. It is noted that while differential stage 202 includes cross-coupled dynamic logic, only a single output 240 is conveyed by differential stage 202. The single output 240 is generally supported by transistors 214, 218, 222, and 226. Consequently, p-channel transistor 230 remains turned off and n-channel transistor 231 remains turned on. As n-channel transistor 232 is turned on by the clock signal clk 206 during the evaluation phase, transistors 231 and 232 discharge state signal 250. Discharge of state signal 250 also causes signal st 252 to go high, which turns on n-channel transistor 233. Therefore, in this scenario, the number of transitions from clock line clk 206 rising to output of the flip flop may be seen as one (the transition caused by transistor 232).

It is noted that since only a single side (i.e., at line 240) of differential stage 202 is utilized to drive the next state of latch stage 204, the transistors forming each side of differential stage 202 may be asymmetrically sized. For example, in the depicted embodiment, the channel widths of transistors 214, 218, 222, and 226 may be larger than those of corresponding transistors 216, 220, 224, and 227. Transistors 218, 222, and 226 are sufficiently sized to quickly discharge line 240 during an evaluation phase, thus accommodating high speed, while power consumption may be reduced due to the relatively smaller size of transistors 216, 220, 224, and 227.

Figure 3:
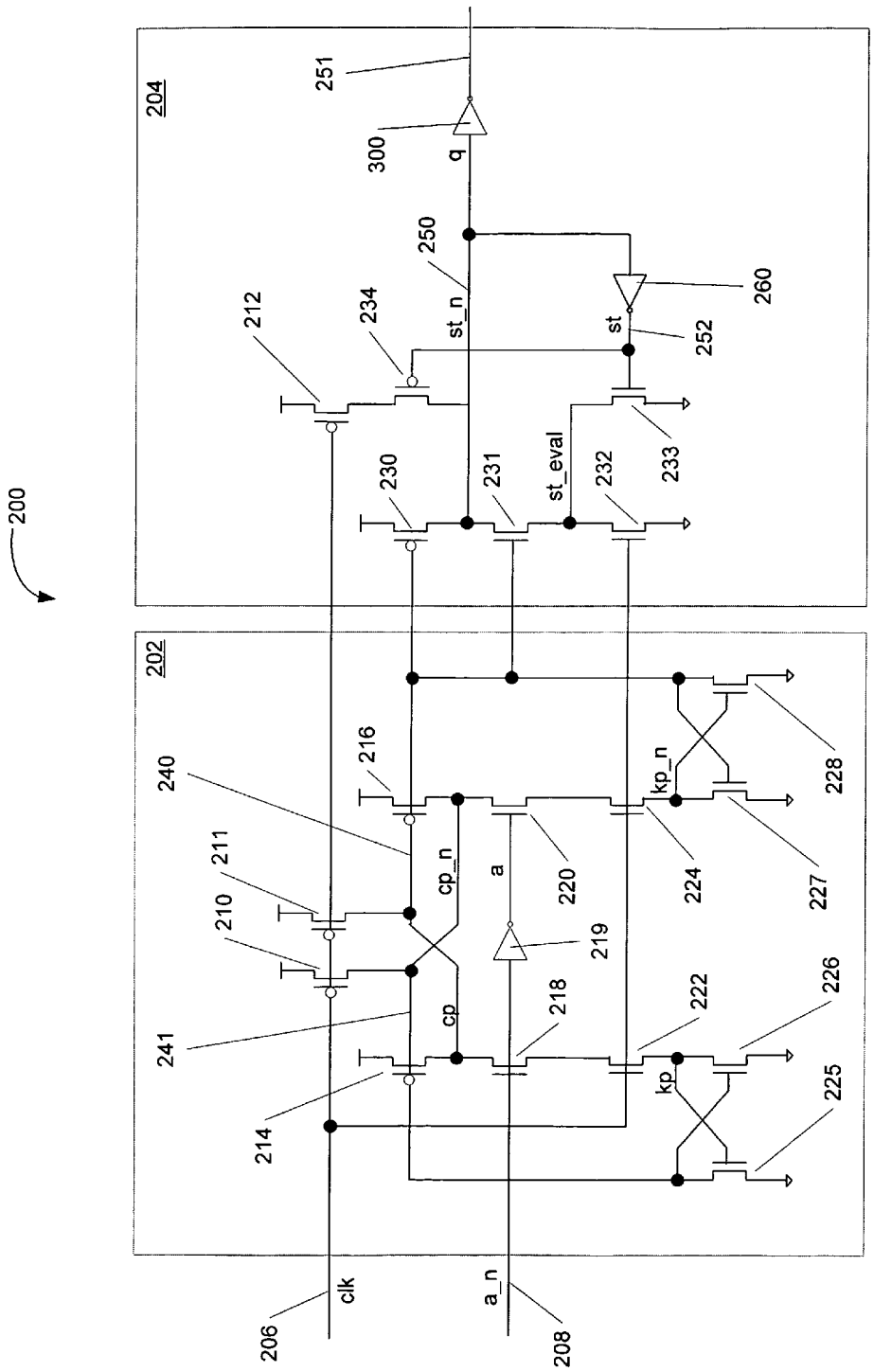
FIG. 3 is a diagram illustrating another embodiment of a flip-flop circuit.

FIG. 3 is a schematic diagram illustrating another embodiment of a flip-flop circuit 200. Circuit portions which correspond to those of FIG. 2 are numbered identically for simplicity and clarity. The flip-flop circuit of FIG. 3 is similar to that of FIG. 2. However, an additional inverter 300 is provided within latch stage 204 to drive the output of the flip-flop circuit at line 251. The embodiment of FIG. 3 may advantageously provide improved isolation of the memory node 250 from the output of the flip-flop circuit at line 251. Accordingly, the flip-flop circuit may be more tolerant of noise at output 251 to thereby avoid data corruption.

Figure 4:
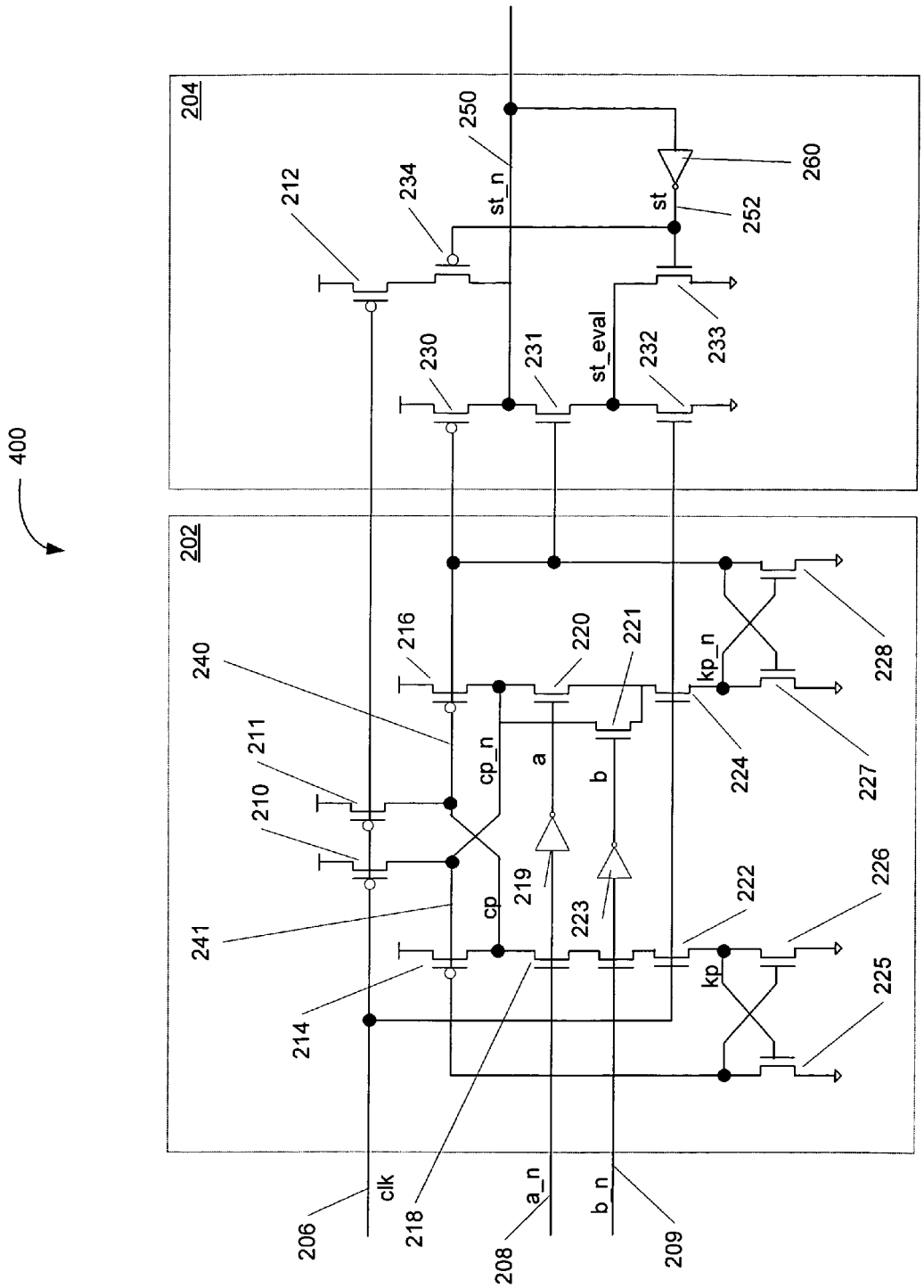
FIG. 4 is a schematic diagram illustrating another embodiment of a flip-flop circuit which incorporates logic NAND functionality.
Figure 5:
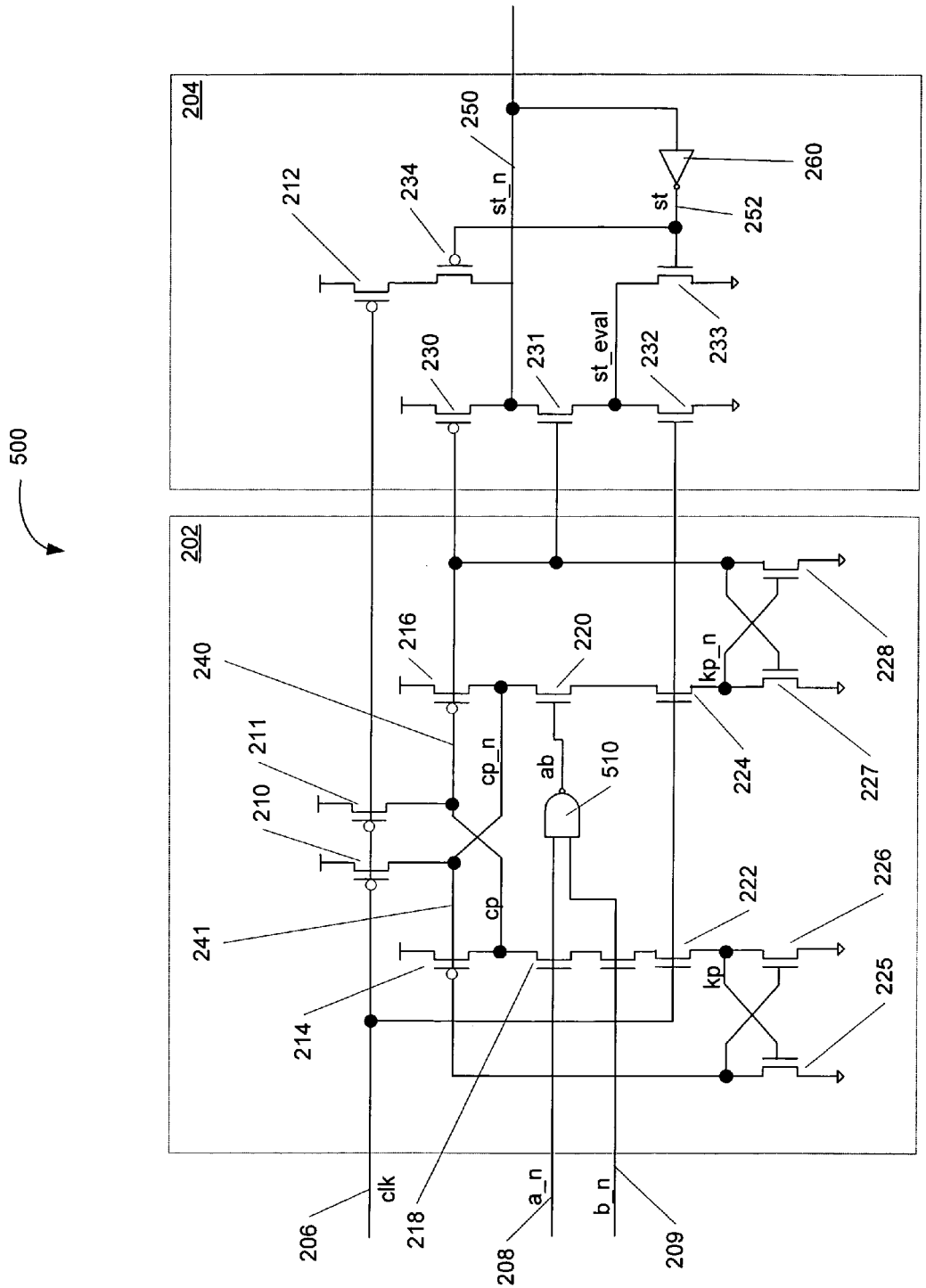
FIG. 5 is a schematic diagram illustrating another embodiment of a flip-flop circuit which incorporates logic NAND functionality.

Turning to FIG. 4, a schematic diagram of yet another embodiment of a flip-flop circuit 400 is shown. Again, circuit portions which correspond to those of FIG. 2 are numbered identically for simplicity and clarity. The flip-flop circuit of FIG. 4 is similar to that of FIG. 2; however, in FIG. 4 differential stage 202 includes logic to perform a NAND operation. In this example, an added n-channel transistor 221 provides an additional discharge path for signal cp_n 241. Also, an additional input b_n 209 coupled to transistor 221 via inverter 223 is provided. Accordingly, signal cp_n 241 may discharge if either or both of signals a_n 208 and b_n 209 are low. In this manner, flip flop circuit 400 incorporates a logic NAND function. FIG. 5 depicts an alternative implementation of the circuit of FIG. 4 wherein inputs a_n 408 and b_n 409 are coupled to a NAND gate 510 in order to provide the NAND function.

Figure 6:
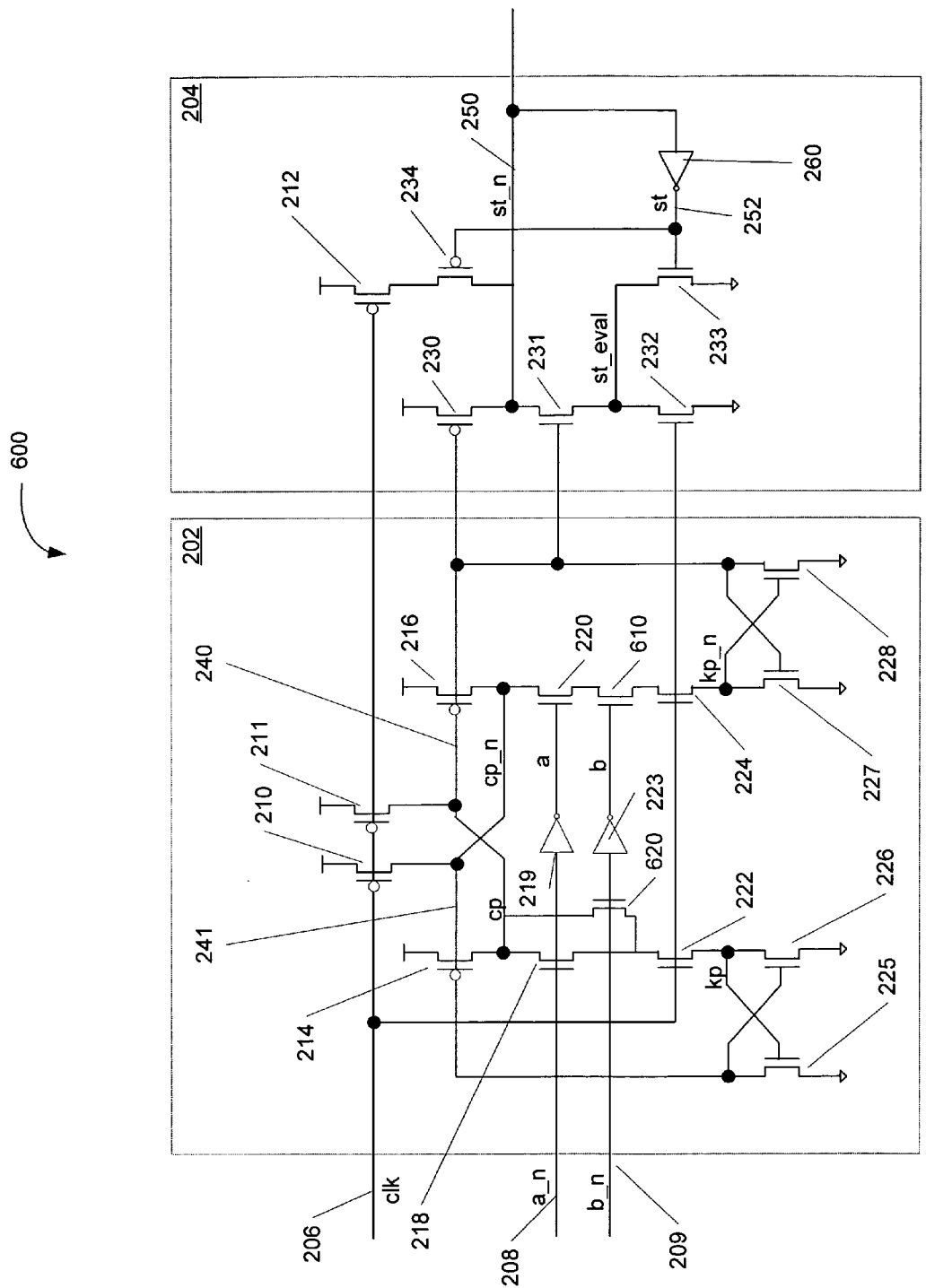
FIG. 6 is a schematic diagram illustrating another embodiment of a flip-flop circuit which incorporates logic NOR functionality.

FIG. 6 depicts one embodiment of another flip flop circuit 600 which incorporates a logic function. In this example, a NOR function is incorporated by adding the n-channel transistor 620 which provides an additional discharge path for signal cp 240. Also, n-channel transistor 610 is added in series to n-channel transistor 220 and coupled to inverter 223. Therefore, signal cp_n 241 may discharge only when both inputs a_n 208 and b_n 209 are low.

Those skilled in the art will appreciate that numerous logic functions may be incorporated into the basic flip flop circuit 200 depicted in FIG. 2, including multiplexing functionality. Numerous such alternatives are possible and are contemplated.

While the present invention has been described with reference to particular embodiments, it will be understood that the embodiments are illustrative and that the invention scope is not so limited. Any variations, modifications, additions and improvements to the embodiments described are possible. These variations, modifications, additions and improvements may fall within the scope of the invention as detailed within the following claims.

What is claimed is:

1. A flip-flop circuit comprising:
   a data input line for receiving a data input signal;
   a clock line for receiving a clock signal;
   a differential stage configured to generate a single differential stage output signal indicative of a state of said data input signal during an evaluation phase of said clock signal; and
   a latch stage for retaining a stored state, said latch stage having a first input coupled to receive said output signal of said differential stage and a second input coupled to receive said clock signal;
   wherein said differential stage comprises cross-coupled dynamic logic, and wherein said differential stage output signal is present upon an output line during the evaluation phase of said clock signal, and wherein said output line is precharged during a precharge phase of said clock signal.

2. The flip-flop circuit as recited in claim 1, wherein a latch stage write port is disabled by the clock signal during the precharge phase of said clock signal.

3. The flip-flop circuit as recited in claim 2, wherein said latch stage write port is enabled by the clock signal during the evaluation phase of said clock signal.

4. The flip-flop circuit as recited in claim 2, wherein said differential stage comprises an output side including a first set of transistors for selectively forming a current path between the output line and a ground reference potential dependent upon the state of said data input signal.

5. The flip-flop circuit as recited in claim 4, wherein said differential stage further comprises a reference side with a reference line, and wherein said reference line is precharged during the precharge phase of said clock signal.

6. The flip-flop circuit as recited in claim 4, wherein said differential stage comprises a second set of transistors for selectively forming a current path between the reference line and the ground reference potential dependent upon the state of said data input signal and said clock signal, wherein said clock signal, not being a bottom-most input in said current path, disables the current path during the precharge phase of said clock signal.

7. The flip-flop circuit as recited in claim 6, wherein each of the first set of transistors corresponds to a different one of the second set of transistors, and wherein at least one of the first set of transistors has a channel width which is greater than a channel width of the corresponding one of the second set of transistors.

8. The flip-flop circuit as recited in claim 1, wherein a reference side of the differential stage includes a reference line and a first keeper circuit comprising cross-coupled transistors, and an output side of the differential stage includes the output line and a second keeper circuit comprising cross-coupled transistors, wherein in response to detecting the data input signal changes during the evaluation phase, one of the first or second keeper circuits is configured to maintain a discharge path for the output line or the reference line, respectively.

9. The flip-flop circuit as recited in claim 1, wherein the latch stage further comprises a feedback circuit configured to hold the state of the latch during the precharge phase.

10. The flip-flop circuit as recited in claim 9, wherein in response to detecting the state is high during the precharge phase, the feedback circuit is configured to disable a discharge path and enable a pull-up circuit for the state, and wherein in response to detecting the state is low during the precharge phase, the feedback circuit is configured to enable the discharge path and disable the pull-up circuit.

* * * * *